United States Patent
Ishimoto (10) Patent No.: US 8,528,198 B2
(45) Date of Patent: Sep. 10, 2013

(54) COMPONENT MOUNTING METHOD

(75) Inventor: Kenichiro Ishimoto, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/255,119

(22) PCT Filed: Dec. 13, 2010

(86) PCT No.: PCT/JP2010/007240
§ 371 (c)(1),
(2), (4) Date: Sep. 7, 2011

(87) PCT Pub. No.: WO2011/074241
PCT Pub. Date: Jun. 23, 2011

(65) Prior Publication Data
US 2012/0240388 A1   Sep. 27, 2012

(30) Foreign Application Priority Data
Dec. 14, 2009   (JP) ................................ P2009-282490

(51) Int. Cl.
*H05K 3/30*   (2006.01)

(52) U.S. Cl.
USPC ................... 29/833; 29/834; 29/740; 29/721; 29/712

(58) Field of Classification Search
USPC .......... 29/714, 740–743, 832–834; 294/64.1, 294/2
See application file for complete search history.

(56) References Cited

U.S. PATENT DOCUMENTS

| | | | | |
|---|---|---|---|---|
| 5,033,185 A * | 7/1991 | Hidese | ............................ | 29/740 |
| 5,212,881 A * | 5/1993 | Nishitsuka et al. | ............. | 29/740 |
| 5,628,107 A * | 5/1997 | Nushiyama et al. | ............ | 29/740 |
| 5,743,005 A * | 4/1998 | Nakao et al. | ..................... | 29/833 |
| 6,016,599 A * | 1/2000 | Morita et al. | .................... | 29/833 |
| 6,584,683 B2 * | 7/2003 | Yoshida et al. | ................. | 29/834 |
| 6,739,036 B2 * | 5/2004 | Koike et al. | ..................... | 29/743 |
| 7,017,261 B2 * | 3/2006 | Okamoto et al. | ............... | 29/832 |
| 2010/0325860 A1 | 12/2010 | Maenishi | | |
| 2012/0240388 A1 * | 9/2012 | Ishimoto | ......................... | 29/593 |

FOREIGN PATENT DOCUMENTS

| | | |
|---|---|---|
| JP | 10-146744 A | 6/1998 |
| JP | 2001-127494 A | 5/2001 |
| JP | 2008-159855 A | 7/2008 |
| JP | 2008-186992 A | 8/2008 |
| JP | 2009-111087 A | 5/2009 |
| JP | 2009-239257 A | 10/2009 |

OTHER PUBLICATIONS

International Search Report for PCT/JP2010/007240 dated Jan. 11, 2011.

* cited by examiner

*Primary Examiner* — Minh Trinh
(74) *Attorney, Agent, or Firm* — Pearne & Gordon LLP (57) ABSTRACT

When a component mounting process by mounting heads is executed on substrates which are positioned alternately by two substrate carrying lines, a determination is made on whether or not a mounting turn can be completed every time the mounting heads perform the mounting turn, and when it is determined that one of the mounting turns performed by the mounting head cannot be completed, a component mounting process is executed on the substrate which is positioned by the substrate carrying line which is opposite to the substrate carrying line.

4 Claims, 8 Drawing Sheets

COMPONENT MOUNTING METHOD

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to a component mounting method and a component mounting device for executing a component mounting process on a substrate by repeating a mounting turn by a mounting head on each of substrates which are positioned by two substrate carrying lines.

2. Description of Related Art including information disclosed under 37 C.F.R. 1.97 and 1.98

<Background Art>

A printed circuit board fabrication line includes a solder printer for printing solder on a substrate, a component mounting device for mounting components (electronic components) on the substrate on which the solder has been printed by the solder printer and a reflow oven where reflow soldering is executed on the substrate on which the components are packaged by the component mounting device, which are arranged consecutively along the carrying direction of substrates. In these constituent units, the component mounting device includes substrate carrying lines where substrates are carried and positioned, a component feeding unit for feeding components, and a mounting head for executing a component mounting process on a substrate by repeating a mounting turn including a series of operations ranging from picking up components fed in by the component feeding unit to mounting the components so picked up on to the substrate.

Among component mounting devices of this type, there is known a component mounting device in which two substrate carrying lines are arranged side by side in a front-to-rear direction of a base table and the component mounting process is executed on each of substrates which are carried in and positioned by the two substrate carrying lines by two mounting heads provided and arranged in the front-to-rear direction of the base table. In the component mounting device described, components can be mounted on substrates by selecting either of an alternating mounting mode in which the component mounting process is executed by the two mounting heads on substrates which are positioned alternately by the two substrate carrying lines and an independent mounting mode in which the component mounting process is executed independently by the two mounting heads on substrates which are positioned by the substrate carrying lines lying closer to the mounting heads (for example, Patent Document 1).

When the component mounting device executes the component mounting process on substrates in the alternating mounting mode, components to be mounted on substrates only have to be distributed to either of the components feeders which are arranged in the front-to-rear direction of the base table, and therefore, the number of parts feeders installed in the base table can be reduced. This enables the use of a component mounting device having a narrow base table, providing an advantage that an increase in length of the printed circuit board fabrication line can be suppressed. On the other hand, when the component mounting device executes the component mounting process on substrates in the independent mounting mode, even in the event that the component mounting process cannot be performed on a substrate positioned by one of the substrate carrying lines (for example, due to the running out of components), the component mounting process may be executed continuously on a substrate positioned by the other substrate carrying line, providing an advantage that there is caused no such situation that the printed circuit board fabrication operations of the printed circuit board fabrication line are not totally stopped.

RELATED ART DOCUMENT

Patent Document

Patent Document 1: JP-A-2009-239257

However, when the component mounting process is executed on substrates in the alternating mounting mode, after the execution of the component mounting process on a substrate to which components are to be mounted is completed, the component mounting process is designed to be shifted to a substrate which is positioned by the opposite substrate carrying line. Therefore, the alternating mounting mode has a problem that when components run out during the execution of the component mounting process on one substrate, the printed circuit board fabrication operations of the printed circuit board fabrication line are totally stopped until the parts feeder that has run out of components is refilled completely. On the other hand, when the component mounting process is executed on substrate in the independent mounting mode, components to be mounted on substrates which are positioned individually by the front and rear substrate carrying lines need to be fed from parts feeders which lie close to the substrate carrying lines. Because of this, although this is possible when the component mounting process is executed on substrates in the alternating mounting mode, components to be mounted on the substrates cannot be distributed to either of the parts feeders arranged in the front-to-rear direction of the base table. Due to this, it is not possible to use a component mounting device with a narrow base table, and therefore, there is caused a problem that the length of the printed circuit board fabrication line tends to be increased.

Then, an object of the invention is to provide a component mounting method and a component mounting device which enable the continuation of fabrication of printed circuit boards even when components run out while executing a component mounting process on one substrate, while suppressing an increase in length of a printed circuit board fabrication line.

BRIEF SUMMARY OF THE INVENTION

According to the invention, there is provided a component mounting method by a component mounting device comprising two substrate carrying lines which are arranged side by side for performing carrying in, positioning and carrying out of substrates, a component feeding unit feeding components, and a mounting head executing a component mounting process on the substrates by repeating a mounting turn including a series of operations ranging from picking up of the components fed by the component feeding unit to mounting the components on to the substrates, wherein the two substrate carrying lines position the substrates alternately, and each substrate carrying line carries out the substrate after the mounting of the components on to the substrate is completed and then carries in and positions the next substrate, the component mounting method including a step of determining whether or not the mounting turn can be completed every time the mounting head performs the mounting turn and, when it is determined that one of the mounting turns performed by the mounting head cannot be completed, executing the component mounting process by the mounting head on the substrate positioned by the substrate carrying line which is opposite to the substrate carrying line which is positioning the substrate constituting the object to which components are to be mounted at the point in time of making the determination by regarding the substrate as an object to which components are to be mounted.

According to the invention, there is provided a component mounting device comprising two substrate carrying lines which are arranged side by side for performing carrying in, positioning and carrying out of substrates, a component feeding unit feeding components, and a mounting head executing a component mounting process on the substrates by repeating a mounting turn including a series of operations ranging from picking up of the components fed by the component feeding unit to mounting the components on to the substrates, wherein the two substrate carrying lines position the substrates alternately, and each of substrate carrying lines carries out the substrate after the mounting of the components on to the substrate is completed and then carries in and positions the next substrate, the component mounting device comprising a determination unit determining whether or not the mounting turn can be completed every time the mounting head performs the mounting turn and a component mounting process execution unit, when the determination unit determines that one of the mounting turns performed by the mounting head cannot be completed, executing the component mounting process by the mounting head on the substrate positioned by the substrate carrying line which is opposite to the substrate carrying line which is positioning the substrate constituting the object to which components are to be mounted at the point in time of making the determination by regarding the substrate as an object to which components are to be mounted.

In the invention, when the component mounting process is executed by the mounting head on the substrates which are positioned alternately by the two substrate carrying lines, every time the mounting head performs the mounting turn, it is determined whether or not the mounting turn can be completed. Then, when it is determined that one of the mounting turns performed by the mounting head cannot be completed, the component mounting process by the mounting heads is executed on the substrate positioned by the substrate carrying line which is opposite to the substrate carrying line which is positioning the substrate constituting the object to which components are to be mounted at the point in time of making the determination by regarding the substrate as an object to which components are to be mounted. Therefore, even in the event that components run out during the execution of the component mounting process on one substrate, the fabrication of printed circuit boards can be executed continuously. In addition, normally, the component mounting process is executed on substrates in the mounting mode which corresponds to the conventional alternate mounting mode, and therefore, the component mounting device having the narrow base table can be used, thereby making it possible to suppress an increase in length of the printed circuit board fabrication line.

DETAILED DESCRIPTION OF THE INVENTION

Figure 1:
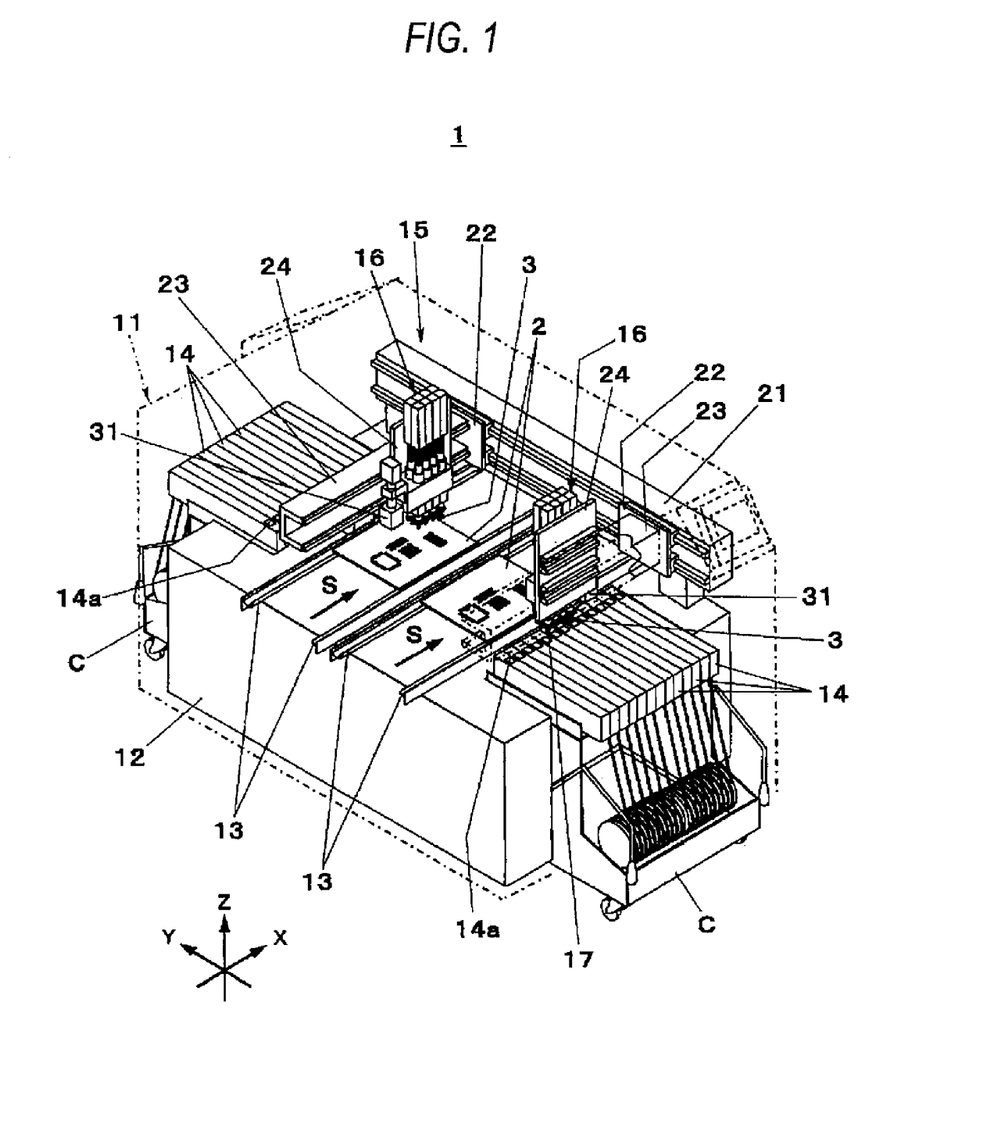
FIG. 1 is a perspective view of a component mounting device according to one embodiment of the invention.

Hereinafter, referring to the drawings, an embodiment of the invention will be described. A component mounting device 1 shown in FIG. 1 is combined with other component mounting units such as a solder printer, an inspection device and a reflow oven, which are not shown, to make up a printed circuit board fabrication line. The component mounting device 1 executes repeatedly a component mounting process made up of steps of carrying in and positioning substrates 2 received from the upstream side unit (for example, the solder printer), mounting components (electronic components) on the substrates 2 positioned and carrying out the substrates 2 to the downstream side unit (for example, the inspection device) after the components have been mounted thereon.

Figure 2:
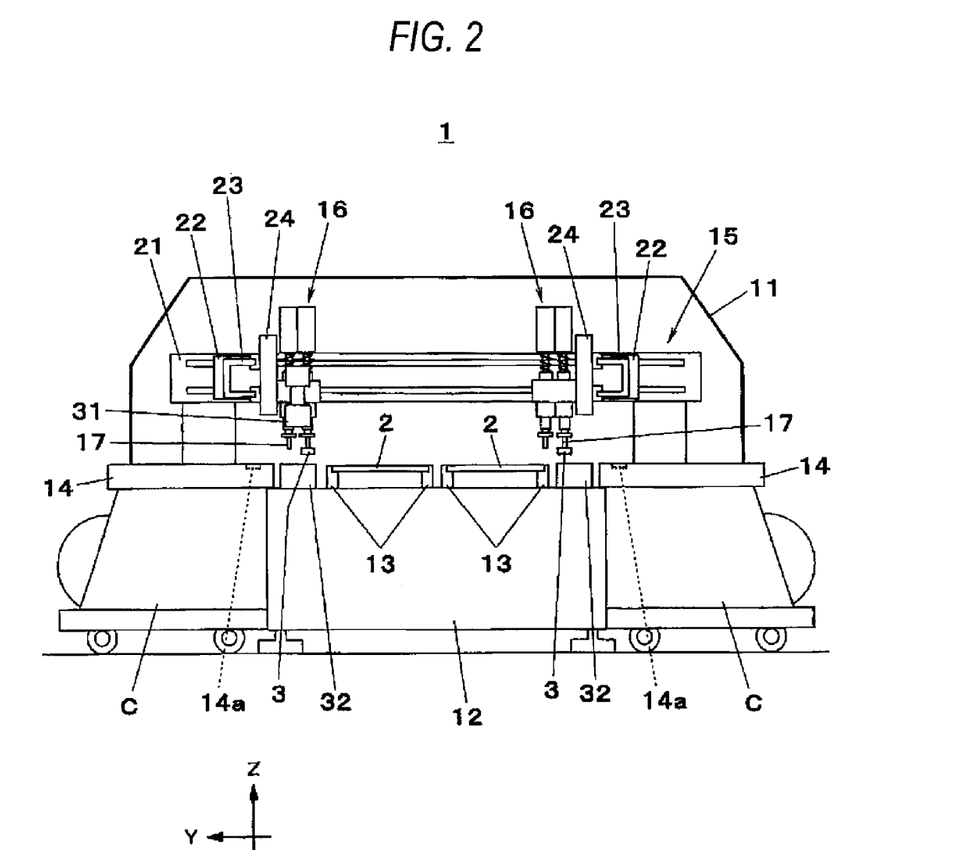
FIG. 2 is a side view of the component mounting device according to the embodiment of the invention.
Figure 3:
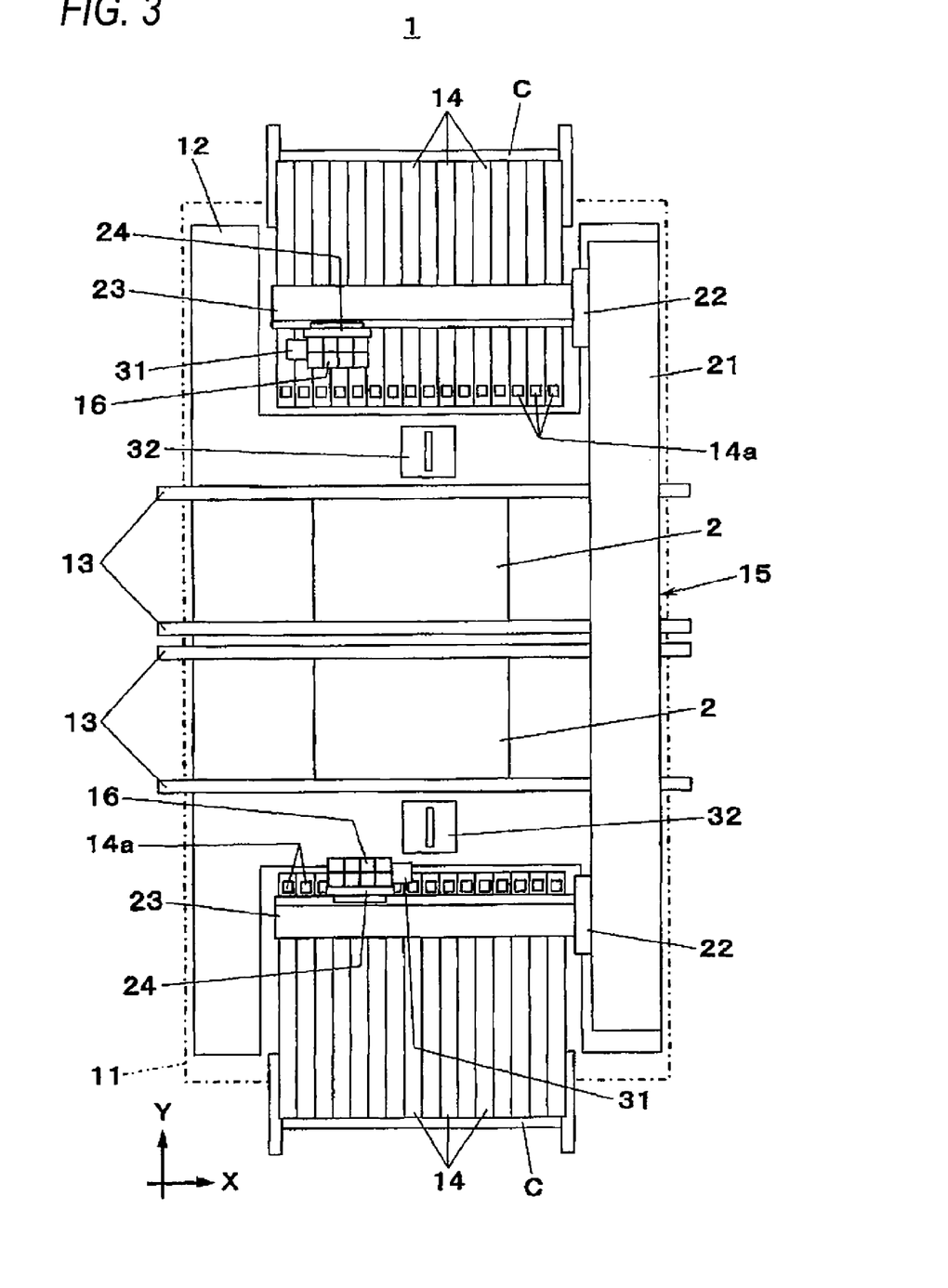
FIG. 3 is a plan view of the component mounting device according to the embodiment of the invention.

In FIGS. 1, 2 and 3, the component mounting device 1 two substrate carrying lines 13 as substrate positioning units which are arranged side by side on a base table 12 which is covered by a cover member 11, a plurality of parts feeders 14 as component feeding units, a head moving mechanism 15 made up of an XY robot, and two mounting heads 16 as component mounting units which are provided on the base table 12 via the head moving mechanism 15 so as to move independently of each other.

In FIGS. 1, 2 and 3, the substrate carrying line 13 includes a pair of belt conveyors and carries a substrate 2 received from the upstream side unit (for example, the solder printer) into a horizontal plane (carrying in) (an arrow S shown in FIG. 1) to position the substrate 2 in a working position (a position shown in FIGS. 1 and 3) which is at the center of the base table 12. Hereinafter, as a matter of convenience, the carrying direction of the substrate 2 in the substrate carrying line 13 is referred to as an X-axis direction, and a direction on the horizontal plane which intersects at right angles to the X-axis direction is referred to as a Y-axis direction. In addition, a vertical direction is referred to as a Z-axis direction.

In FIGS. 1, 2, and 3, the plurality of parts feeders 14 are installed at end portion areas of the base table 12 which face each other in the Y-axis direction across the substrate carrying lines 13 so as to be aligned in the X-axis direction. These parts feeders 14 are held on trolleys C which are operated to move on the floor surface by the operator (not shown), so that by joining the trolleys C to the base table 12 by the operator, the plurality of parts feeders 14 are installed in the base table 12 altogether. Each parts feeder 14 installed in the base table 12 continuously feeds components 3 to a component feeding port provided at an end portion facing a central portion (the substrate carrying line 13) of the base table 12.

In FIGS. 1, 2 and 3, the two mounting heads 16 are caused to move freely within the horizontal plane by the head moving mechanism 15, and each mounting head 16 includes a plurality of downwardly extending suction nozzles 17 which ascend and descend and rotate about the vertical axis (the Z-axis).

In FIGS. 1 to 3, the head moving mechanism 15 includes a beam-like Y-axis table 21 which is provided so as to straddle the substrate carrying lines 13 in the Y-axis direction, plate-like moving tables 22 which are provided so as to move on the Y-axis table 21 in the direction of the Y-axis, beam-like X-axis tables 23 which are provided so as to be fixed to the moving tables 22 at one end portions thereof, and plate-like moving stages 24 which are provided so as to move on the X-axis tables 23 in the X-axis direction. The mounting head 16 is attached to each moving stage 24.

In FIGS. 1, 2 and 3, a substrate camera 31 whose image capturing field is directed downwards is provided on each of the two moving stages 24 provided on the head moving mechanism 15. A component camera 32 whose image capturing field is directed upwards is provided in each of areas which hold the two substrate carrying lines 13 on the base table 12 therebetween.

The carrying and positioning operations of the substrate 2 by each substrate carrying line 13 is implemented by controlling the operation of a substrate carrying line driving unit 41 (FIG. 4) which is made up of an actuator, not shown, by an operation execution control unit 40a (FIG. 4) of a controller 40 provided in the component mounting device 1. A feeding operation of components 3 to the component feeding port 14a by each parts feeder 14 is implemented by controlling the operation of a parts feeder drive unit 42 (FIG. 4) made up of an actuator, not shown, by the operation execution control unit 40a of the controller 40.

A moving operation of each mounting head 16 in the horizontal plane by the head moving mechanism 15 is implemented by controlling the operation of a head moving mechanism drive unit 43 (FIG. 4) made up of an actuator, not shown, by the operation execution control unit 40a of the controller 40 (controlling the movement of each moving table 22 in the Y-axis direction relative to the Y-axis table 21 and controlling the movement of each moving stage 24 in the X-axis direction relative to each X-axis table 23). Ascending and descending operations of each suction nozzle 17 relative to the mounting head 16 and rotating operation of the suction nozzle 17 about the vertical axis are implemented by controlling the operation of a nozzle drive unit 44 (FIG. 4) made up of an actuator, not shown, by the operation execution control unit 40a of the controller 40. In addition, sucking and releasing operations of a component 3 by each suction nozzle 17 is implemented by controlling the operation of a vacuum supply unit 45 (FIG. 4) made up of an actuator, not shown, by the operation execution control unit 40a of the controller 40 so as to supply a vacuum or release the supply of a vacuum.

Figure 4:
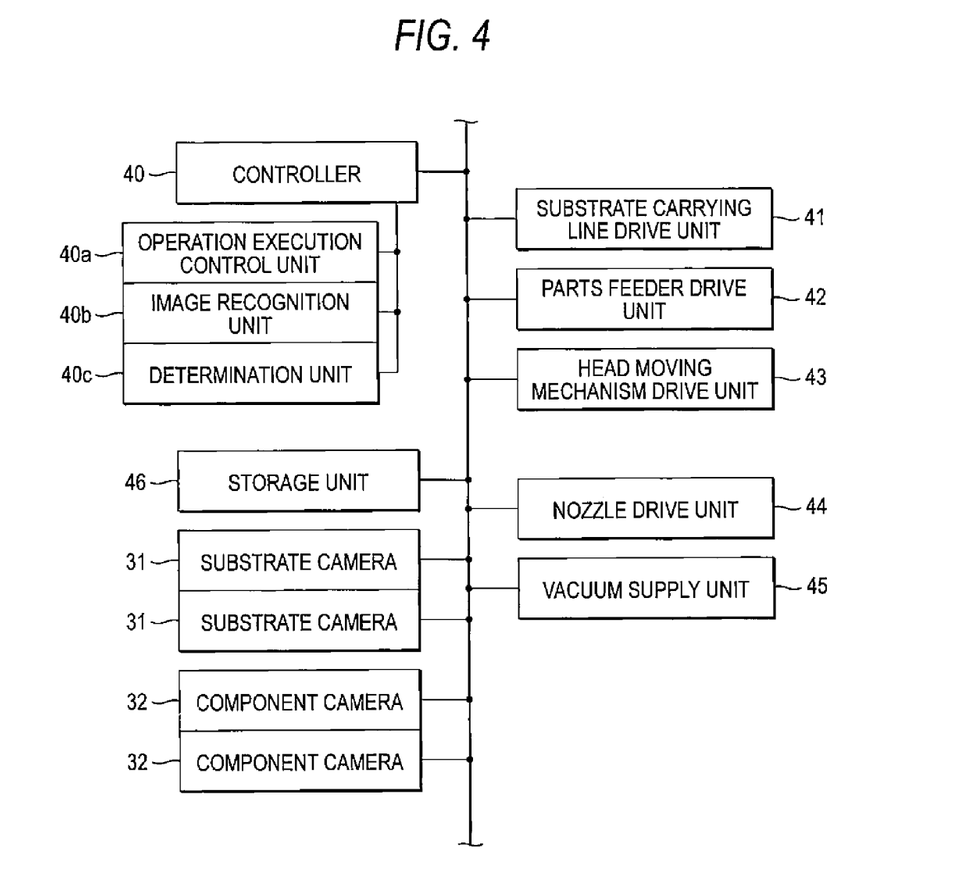
FIG. 4 is a block diagram showing a control system of the component mounting device according to the embodiment of the invention.

Image capturing operations by the substrate cameras 31 and the component cameras 32 are implemented by controlling the operations of the substrate cameras 31 and the component cameras 32 by the operation execution control unit 40a of the controller 40 (FIG. 4). Image data extracted by image capturing operations of the substrate cameras 31 and the component cameras 32 is captured in a storage unit 46 (FIG. 4) to be stored therein and are then image recognized at an image recognition unit 40b (FIG. 4) provided in the controller 40.

When the component mounting process of mounting components 3 on substrates 2 carried out from the upstream side unit (for example, the solder printer) by the component mounting device 1 configured as has been described above, the operation execution control unit 40a of the controller 40 controls the operations of the two mounting heads 16 in association with controlling the operations of the two substrate carrying lines 13.

Figure 5:
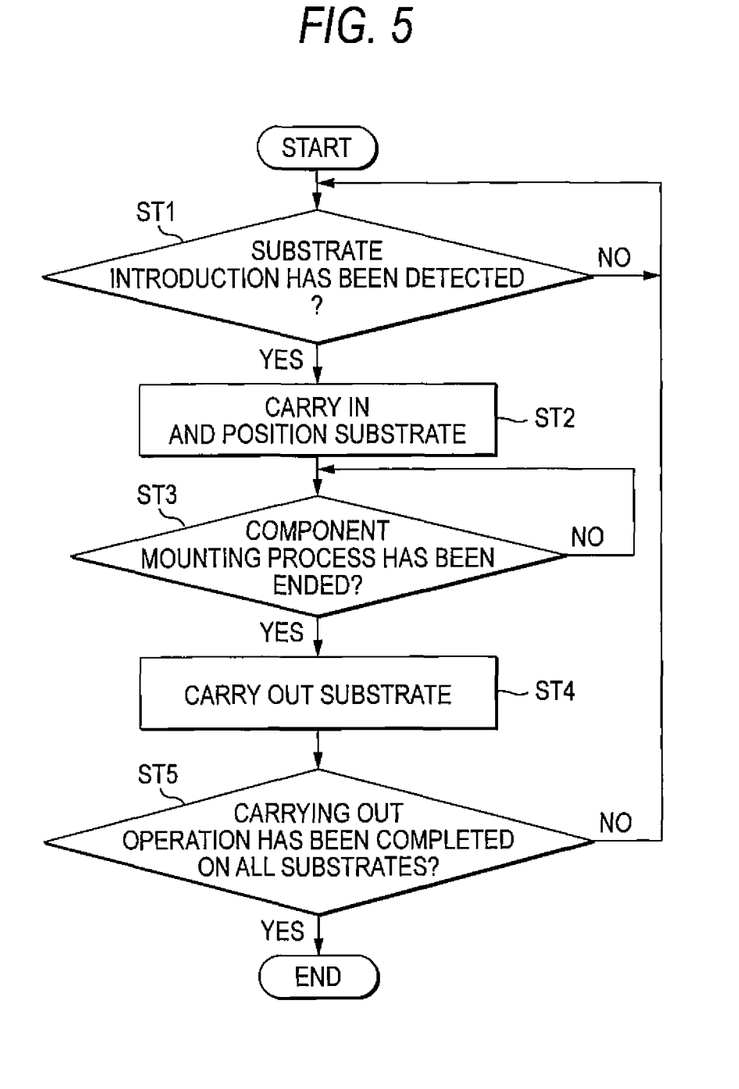
FIG. 5 is a flowchart showing an operation control procedure of substrate carrying lines provided on the component mounting device according to the embodiment of the invention.

In controlling the operation of each substrate carrying line 13, when detecting the introduction of a substrate 2 from the upstream side unit by a substrate introduction detector, not shown, the operation execution control unit 40a of the controller 40 firstly actuates the substrate carrying line 13 to receive the substrate 2, carries in the substrate 2 in the direction of the X-axis (carrying in) and positions the substrate 2 in a working position (step ST1 and step ST2 in FIG. 5). When position the substrate 2 in step ST2, the mounting head 16 lying close to the substrate carrying line 13 concerned is moved to a position lying above a substrate mark (not shown) provided on the substrate 2 to capture an image of the substrate mark by the substrate camera 31. Then, the image obtained is image recognized by the image recognition unit 40b, whereby a position shift from the normal working position of the substrate 2 is calculated.

After the position shift of the substrate 2 has been calculated, the operation execution control unit 40a of the controller 40 determines whether or not the two mounting heads 16 have completed a component mounting process, which will be described later, (step ST3 in FIG. 3). When determined that the component mounting process has been completed, the operation execution control unit 40a of the controller 40 carries out the substrates 2 (step ST4 in FIG. 5). Then, the operation execution control unit 40a of the controller 40 determines whether or not the carrying operation (carrying in, positioning and carrying out operations) has been completed on all substrates 2 on which the component mounting process is to be executed (step ST5 in FIG. 5). When the operation execution control unit 40a of the controller 40 determines that the carrying operation has not yet been completed on all the substrates 2, the fabrication flow returns to step ST1 for preparation for carrying in of the next substrate 2. In contrast, when the operation execution control unit 40a of the controller 40 determines that the carrying operation has been completed on all the substrates 2, the carrying operation of substrates 2 by the substrate carrying lines 13 are completed.

Figure 6:
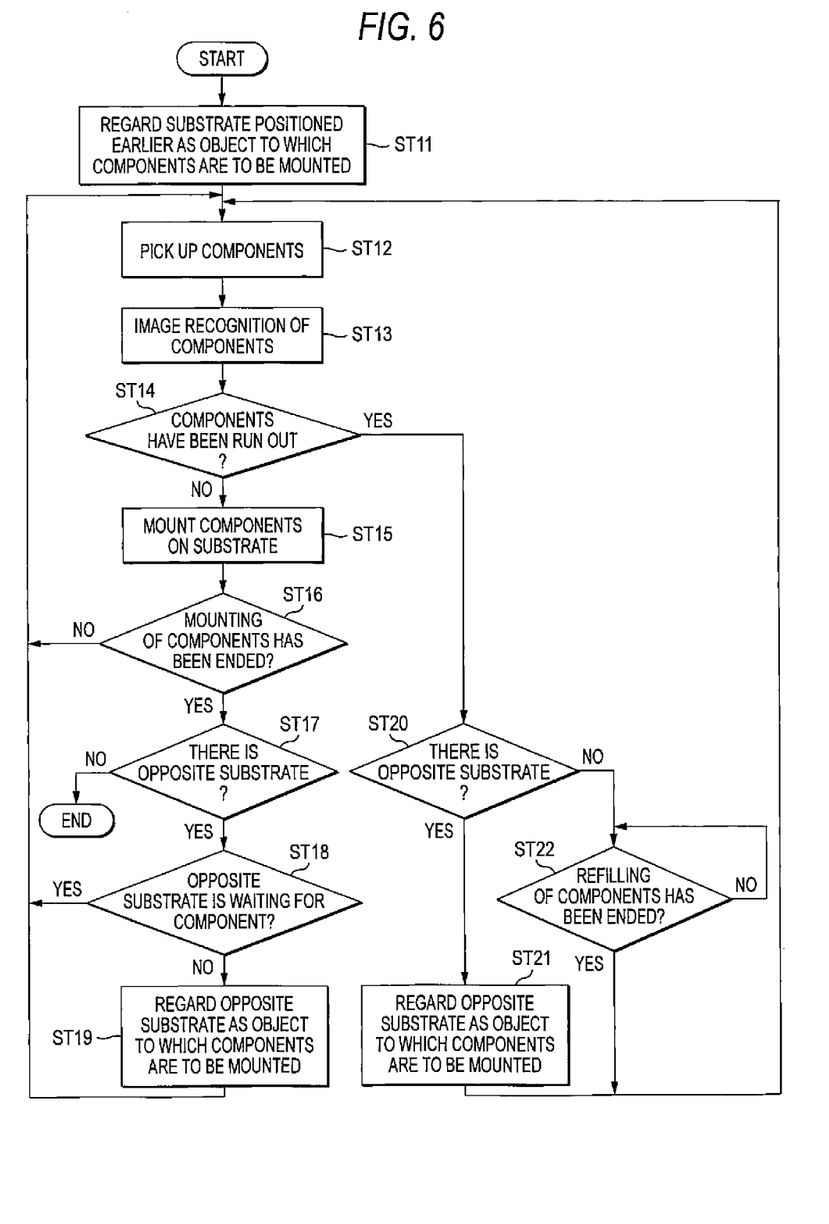
FIG. 6 is a flowchart showing an operation control procedure of a mounting head provided on the component mounting device according to the embodiment of the invention.
Figure 7:
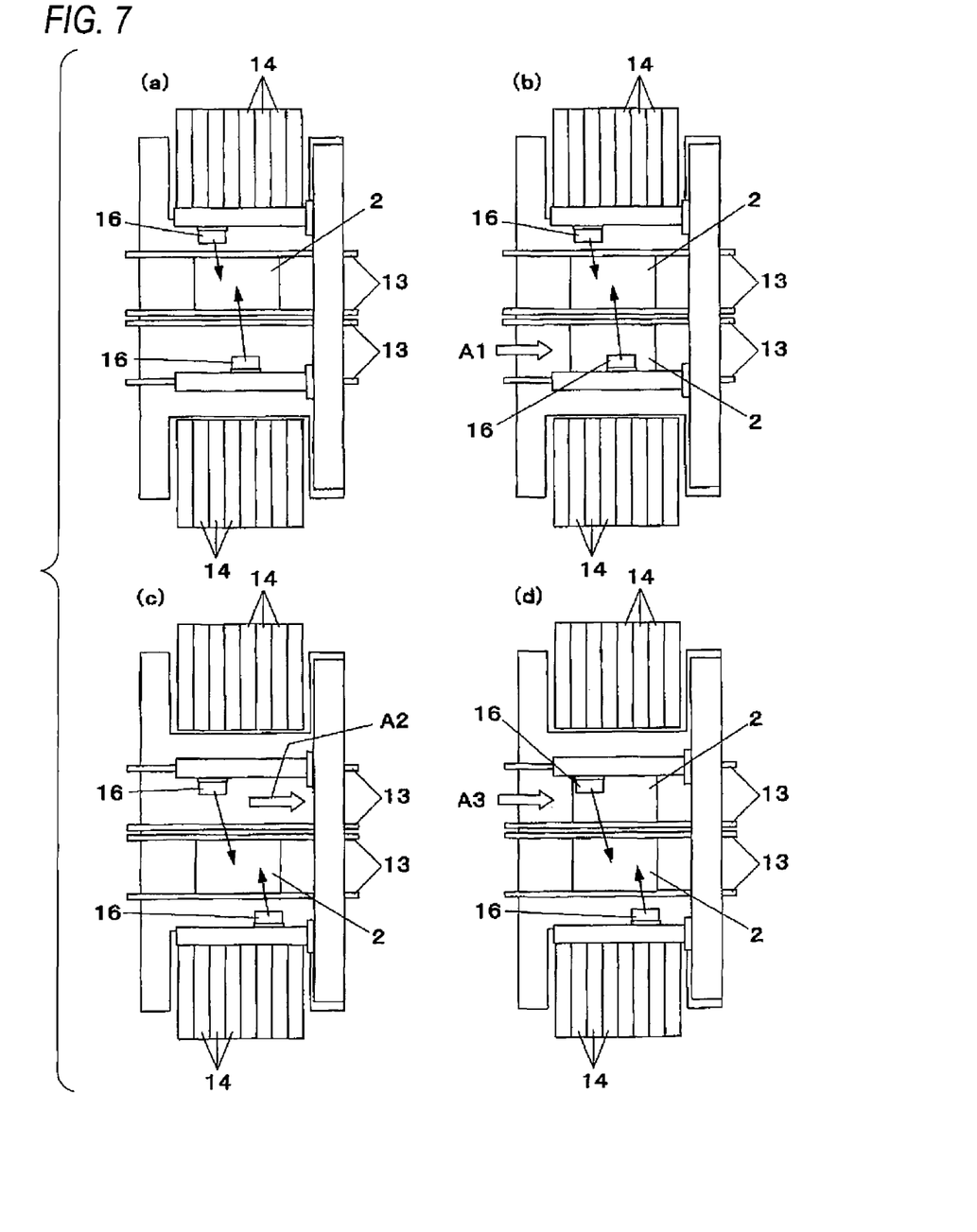
FIG. 7 shows explanatory diagrams (a), (b), (c), (d) which depict a mounting procedure of components on to a substrate by the component mounting device according to the embodiment of the invention.

In controlling the operations of the two mounting heads 16, the operation execution control unit 40a of the controller 40 regards, of substrates 2 which are positioned by the two substrate carrying lines 13, the substrate 2 which is positioned earlier as an object to which components are to be mounted (step ST11 in FIG. 6), and the two mounting heads 16 are caused to execute individually the component mounting process on the substrate 2 regarded as the object to which components to be mounted (step ST12 to step ST16 in FIG. 6 and FIG. 7(a)).

In the component mounting process on the substrate 2, the operation execution control unit 40a of the controller 40 firstly moves the mounting head 16 above the parts feeders 14 which feed components 3 to be mounted on the substrate 2 regarded as the object to which components are to be mounted, causes the suction nozzles 17 to descend, supplies a vacuum into each of the suction nozzles 17 with lower end portions of the suction nozzles 17 kept in contact with the components 3 fed to the component feeding ports 14a of the parts feeders 14, causes the suction nozzles 17 to suck the components 3 and causes the suction nozzles 17 to ascend so as to pick up the components 3 (step ST12 in FIG. 6). Then, while moving the mounting head 16 towards the substrate 2, the operation execution control unit 40a of the controller 40 arranges for the components 3 sucked by the suction nozzles 17 to sequentially pass over the component camera 32, causes the component camera 32 to capture images of the components 3, and causes the image recognition unit 40b to capture the image data of the components 3 captured by the component camera 32 for image recognition (step ST13 in FIG. 6). The operation execution control unit 40a of the controller 40 inspects whether or not abnormalities (deformation, deficiency and the like) are present in the components 3 based on the results of the image recognition by the image recognition unit 40b and calculates a position shift (suction error) of the component 3 relative to the suction nozzle 17. In addition, the determination unit 40c (FIG. 4) provided in the controller 40 determines whether or not running out of components is occurring in the parts feeders 14 based on information on whether or not the components 3 are sucked to the suction nozzles 17 which is obtained from the results of image recognition of the components 3 by the image recognition unit 40b (step ST14 in FIG. 6).

When the determination unit 40c determines that no running out of components is occurring in the parts feeders 14, the operation execution control unit 40a of the controller 40 moves the mounting head 16 above a target mounting position (a solder is printed on an electrode, not shown, which is provided in this target mounting position by the solder printer) on the substrate 2 and lowers the suction nozzles 17. Then, when the components 3 are brought into contact with the target mounting position on the substrate, the supply of vacuums to the suction nozzles 17 is released, and the suction nozzles 17 are raised after the components 3 have been detached from the suction nozzles 17, whereby the components 3 are mounted on the substrate 2 (step ST15 in FIG. 6). When the components 3 are mounted on the substrate 2, the positions of the suction nozzles 17 relative to the substrate 2 are corrected (including rotation correction) so that the position shift of the substrate 2 calculated in step ST2 and the suction error of the components 3 calculated in step ST13 are corrected.

In this way, each mounting head 16 repeats the series of operations performed from step ST12 to step ST15, that is, from the picking up operation of the components 3 fed by the parts feeders 14 to the mounting operation of the components so picked up on to the substrate 2 (hereinafter, this series of operations being referred to as a "mounting turn") to thereby execute the component mounting process on the substrate 2. In addition, in each mounting turn, a determination is made on whether or not running out of component is occurring in the parts feeders 14 (step ST14). When it is determined that a certain component feed 14 is running out of components 3, the components 3 supplied by the parts feeder 14 cannot be mounted on the substrate 2, and therefore, it is determined that the mounting turn concerned cannot be completed. In this way, in this embodiment, the step is provided of determining, every time the mounting head 16 performs a mounting turn, whether or not the mounting turn can be completed. When it is determined that one mounting turn cannot be completed during the execution of the component mounting process on one substrate 2, as will be described later, on condition that a substrate 2 is positioned in the opposite substrate carrying line 13 to the substrate carrying line 13 which is positioning the substrate 2 regarded as the object to which components to be mounted, the current component mounting process is shifted to a component mounting process for the substrate 2 which is being positioned in the opposite substrate carrying line 13 by regarding the substrate 2 as an object to which components are to be mounted.

When one mounting turn is completed (ended) by executing the component mounting operation of mounting the components 3 sucked to the suction nozzles 17 on the target mounting position on the substrate 2 on each suction nozzle 17, the operation execution control unit 40a of the controller 40 determines whether or not all the components have been mounted completely on the substrate 2 which is the object to which components are to be mounted (all the mounting turns to be executed have been executed) (step ST16 in FIG. 16). Then, as the result of the determination, when it is determined that all the components have not yet been mounted completely, the fabrication flow returns to step ST12, where the mounting turn is executed on the component or components 3 which have not yet been mounted on the substrate 2. While the mounting turn is being so executed, an additional substrate 2 is carried in to be positioned by the opposite substrate carrying line 13 to the substrate carrying line 13 which is positioning the substrate 2 which is currently regarded as the object to which components are to be mounted (FIG. 7(b), and an arrow A1 shown in the figure).

On the other hand, when it is determined in step ST16 that all the components have been mounted completely, then, it is determined whether or not a substrate 2 is positioned in the opposite substrate carrying line 13 to the substrate carrying line 13 which is positioning the substrate 2 currently constituting the object to which components are to be mounted, that is, whether or not there exists an opposite substrate 2 (step ST17 in FIG. 16). As a result of the determination, when it is determined that the substrate 2 is positioned in the opposite substrate carrying line 13 (when it is determined that there is he opposite substrate 2), then, it is determined whether or not the substrate 2 is currently waiting for the parts feeder 14 to be refilled with components 3 (ST 18 in FIG. 16). Here, "waiting for the feeder 14 to be refilled with components 3" means a state in which due to the mounting operation of a component 3 on the substrate 2 being unable to be executed successively because of running out of components 3 occurring in the parts feeder 14 for feeding components 3 to be mounted on substrates 2, refilling of the parts feeder 14 with components 3 by the operator is being waited for.

When it is determined in step ST18 that the substrate 2 (the opposite substrate 2) which is being positioned by the opposite substrate carrying line 13 to the substrate carrying line which is positioning the substrate 2 currently constituting the object to which components are to be mounted is not currently waiting for a component 3, regarding the opposite substrate 2 (the substrate 2 which is being positioned by the opposite substrate carrying line 13) as a new object to which components are to be mounted (step ST19), the operation execution control unit 40a of the controller 40 returns the fabrication flow to step ST12, where the operation execution control unit 40a of the controller 40 executes the component mounting process by the two mounting heads 16 on to the substrate 2 which is now regarded as the object to which components are to be mounted (FIGS. 7(c) and 7(d)). During the execution of the component mounting process, the substrate 2 on which the component mounting process is completed by the opposite substrate carrying line 13 to the substrate carrying line 13 which is positioning the substrate 2 which is currently regarded as the object to which components are to be mounted is carried out of the component mounting device (an arrow A2 shown in FIG. 7(c)), and further, an additional substrate 2 is carried thereinto to be positioned in place (an arrow A3 shown in FIG. 7(d)).

On the other hand, it is determined in step ST18 that the opposite substrate 2 is waiting for a component 3, the fabrication flow returns to step ST12 with nothing carried out (without regarding the opposite substrate 2 as an object to which components are to be mounted), where the component mounting process by the operation execution control unit 40a of the controller is executed by the two mounting heads 16 on the substrate 2 which is newly carried in to be positioned by the substrate carrying line 13 (which is the substrate carrying line 13 which has positioned the substrate 2 which has been regarded as the object to which components are to be mounted).

Figure 8:
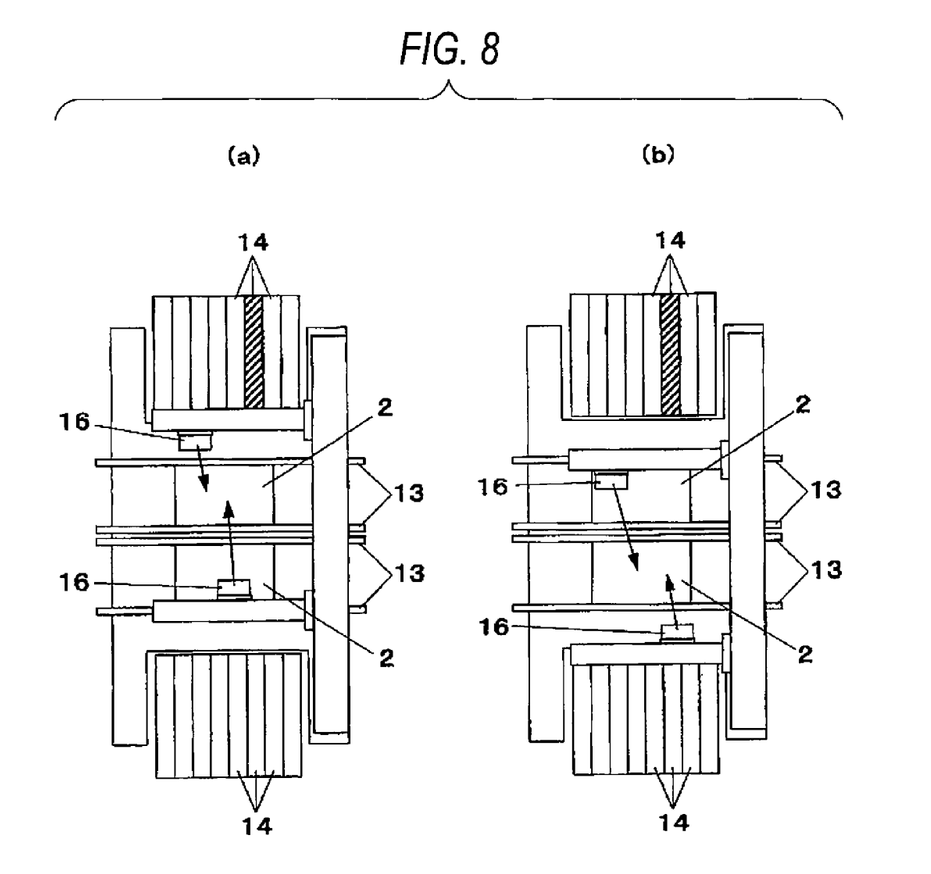
FIG. 8 shows explanatory diagrams (a), (b) which depict a mounting procedure of components on to a substrate by the component mounting device according to the embodiment of the invention.

Here, in the determination made in step ST14 on whether or not running out of components is occurring in the parts feeders 14, when the operation execution control unit 40a of the controller 40 determines that the parts feeder 14 is running out of components (a shaded parts feeder 14 in FIG. 8(a) is running out of components), the operation execution control unit 40a of the controller 40 determines whether or not a substrate 2 is being positioned in the opposite substrate carrying line 13 to the substrate carrying line 13 which is positioning the substrate 2 currently regarded as the object to which components are to be mounted (whether or not there is an opposite substrate 2) (step ST20 in FIG. 6). Then, as a result of the determination, when the operation execution control unit 40a of the controller 40 determines that there is an opposite substrate 2, the component mounting process executed by the two mounting heads 16 on the substrate 2 which has been regarded as the object to which components are to be mounted is interrupted, and regarding the substrate 2 (the opposite substrate 2) which is being positioned by the opposite substrate carrying line 13 as an object to which components are to be mounted (step ST21 in FIG. 6), the fabrication flow returns to step ST12, where the component mounting process is executed by the two mounting heads 16 on the substrate 2 which is newly regarded as the object to which components are to be mounted (FIG. 8(b)).

On the other hand, when determining in step ST20 that there is no opposite substrate 2, the operation execution control unit 40a of the controller 40 determines whether or not the parts feeder 14 which has run out of components has been refilled with components 3 (step ST22 in FIG. 6). Then, when the operation execution control unit 40a of the controller 40 determines that the parts feeder 14 has been refilled with components 3, the fabrication flow returns to step ST12, where the component mounting process by the two mounting heads 16 is resumed on the substrate 2 which has been waiting for a component 3.

In this way, in the component mounting device 1 (the component mounting method by the component mounting device) according to the embodiment of the invention, when it is determined that one mounting turn executed by the mounting head 16 cannot be completed (here, when it is determined that the parts feeder 14 runs out of components), the component mounting process by the mounting heads 16 is executed on the substrate 2 which is being positioned by the opposite substrate carrying line 13 to the substrate carrying line 13 which is positioning the substrate 2 which is currently regarded as the object to which components 3 are to be mounted at the point in time of making the determination by regarding the substrate as an object to which components 3 are to be mounted. Namely, when running out of components occurs while the component mounting process is being executed on one of the two substrates 2 which are being positioned by the two substrate carrying lines 13, it is not that the printed circuit board fabricating operation is stopped totally at the point in time of occurrence of the running out of components but that the component mounting process is shifted to the substrate 2 which is being positioned by the other substrate carrying line 13 so as to keep processing the substrate 2 for fabrication of a printed circuit board.

Thus, as has been described heretofore, according to the embodiment, there is provided the component mounting method by the component mounting device 1 comprising the two substrate carrying lines 13 which are arranged side by side for performing carrying in, positioning and carrying out of substrates 2, the parts feeders 14 as the component feeding units for feeding components 3, and the mounting heads 16 for executing the component mounting process (step ST12 to step ST16) on the substrates 2 by repeating the mounting turn (step ST12 to step ST15) including the series of operations ranging from picking up of the components 3 fed by the parts feeders 14 to mounting the components 3 on to the substrates 2, wherein the two substrate carrying lines 13 position the substrates 2 alternately, and each substrate carrying line 13 carries out the substrate 2 after the mounting of the components 3 on to the substrate 2 is completed and then carries in and positions the next substrate 2, the component mounting method characterized by including the step (step ST14) of determining whether or not the mounting turn can be completed every time the mounting heads 16 perform the mounting turn and a step (step ST21 and step ST12 to step ST16) of, when it is determined that one of the mounting turns performed by the mounting head 16 cannot be completed, executing the component mounting process by the mounting head 16 on the substrate 2 positioned by the substrate carrying line 13 which is opposite to the substrate carrying line 13 which is positioning the substrate 2 constituting the object to which components 3 are to be mounted at the point in time of making the determination by regarding the substrate 2 as an object to which components 3 are to be mounted.

In addition, according to the embodiment, there is provided the component mounting device 1 comprising the two substrate carrying lines 13 which are arranged side by side for performing carrying in, positioning and carrying out of substrates 2, the parts feeders 14 as the component feeding units for feeding components 3, and the mounting heads 16 for executing the component mounting process (step ST12 to step ST16) on the substrates 2 by repeating the mounting turn (step ST12 to step ST15) including the series of operations ranging from picking up of the components 3 fed by the parts feeders 14 to mounting the components 3 on to the substrates 2, wherein the two substrate carrying lines 13 position the substrates 2 alternately, and each substrate carrying line 13 carries out the substrate 2 after the mounting of the components 3 on to the substrate 2 is completed and then carries in and positions the next substrate 2, the component mounting method characterized by comprising a determination unit (the determination unit 40c of the controller 40) for determining whether or not the mounting turn can be completed every time the mounting heads 16 perform the mounting turn and a component mounting process execution unit (the operation execution control unit 40a of the controller 40) for, when the determination unit determines that one of the mounting turns performed by the mounting head 16 cannot be completed, executing the component mounting process by the mounting heads 16 on the substrate 2 positioned by the substrate carrying line 13 which is opposite to the substrate carrying line 13 which is positioning the substrate 2 constituting the object to which components are to be mounted at the point in time of making the determination by regarding the substrate 2 as an object to which components are to be mounted.

In the component mounting method and the component mounting device 1 according to the embodiment, when the component mounting process is executed by the mounting heads 16 on the substrates 2 which are positioned alternately by the two substrate carrying lines 13, every time the mounting heads 16 perform the mounting turn, it is determined whether or not the mounting turn can be completed. Then, when it is determined that one of the mounting turns performed by the mounting head 16 cannot be completed, the component mounting process by the mounting heads 16 is executed on the substrate 2 positioned by the substrate carrying line 13 which is opposite to the substrate carrying line 13 which is positioning the substrate 2 constituting the object to which components 3 are to be mounted at the point in time of making the determination by regarding the substrate 2 as an object to which components are to be mounted. Therefore, even in the event that components run out during the execution of the component mounting process on one substrate 2, the fabrication of printed circuit boards can be executed continuously. In addition, normally, the component mounting process is executed on substrates 2 in the mounting mode which corresponds to the conventional alternate mounting mode, and therefore, the component mounting device having the narrow base table can be used, thereby making it possible to suppress an increase in length of the printed circuit board fabrication line.

While the embodiment of the invention has been described heretofore, the invention is not limited to what has been described above. For example, in the embodiment described above, while the running out of components in the parts feeder 14 is described as being the example of the case where one of the mounting turns performed by the mounting heads 16 cannot be completed, the case where one of the mounting turns performed by the mounting heads 16 cannot be completed includes, in addition thereto, a case where the suction nozzles 17 are detected as being inappropriate or failing.

This patent application is based on Japanese Patent Application (No. 2009-282490) filed on Dec. 14, 2009, the contents of which are to be incorporated herein by reference.

There can be provided the component mounting method and the component mounting device which enable the continuation of fabrication of printed circuit boards even when components run out while executing a component mounting process on one substrate, while suppressing an increase in length of a printed circuit board fabrication line.

1 Component mounting device; 2 Substrate; 3 Component; 13 Substrate carrying line; 14 Parts feeder (Component feeding unit); 16 Mounding head; 40*a* Operation execution control unit (Component mounting process execution unit); 40*c* Determination unit (Determination unit).

SEQUENCE LISTING

Not Applicable

The invention claimed is:

1. A component mounting method comprising the steps of:
providing a component mounting device comprising two substrate carrying lines which are arranged side by side for performing carrying in, positioning and carrying out of substrates, a component feeding unit feeding components; and a mounting head executing a component mounting process on the substrates by repeating a mounting turn including a series of operations ranging from picking up of the components fed by the component feeding unit to mounting the components on to the substrates, wherein the two substrate carrying lines position the substrates alternately, and each of the substrate carrying lines carries out the substrate after the mounting of the components on to the substrate is completed and then carries in and positions the next substrate;
mounting the components on the substrates by repeating the mounting turn;
determining whether or not the mounting turn can be completed every time the mounting head performs the mounting turn; and
when it is determined that one of the mounting turns performed by the mounting head cannot be completed, executing the component mounting process by the mounting head on the substrate positioned by the substrate carrying line which is different from the substrate carrying line which is positioning the substrate constituting the object to which components are to be mounted at the point in time of making the determination by regarding the substrate as an object to which components are to be mounted.

2. The component mounting method according to claim 1, wherein when it is determined that one of the mounting turns performed by the mounting head is completed, determining whether or not an opposite substrate on an opposite substrate carrying lane is currently waiting for the component feeding unit to be refilled with the components; and
when it is determined that the opposite substrate is not currently waiting for the component feeding unit to be refilled with the components, regarding the opposite substrate as a new object to which the components are to be mounted.

3. The component mounting method according to claim 1, wherein the determining step comprises determining whether or not the mounting turn can be completed without running out of the components every time the mounting head performs the mounting turn.

4. The component mounting method according to claim 1, wherein the executing step comprises when it is determined that one of the mounting turns performed by the mounting head cannot be completed due to running out of the components, executing the component mounting process by the mounting head on the substrate positioned by the substrate carrying line which is different from the substrate carrying line which is positioning the substrate constituting the object to which components are to be mounted at the point in time of making the determination by regarding the substrate as an object to which components are to be mounted.

* * * * *